US012537172B2

(12) United States Patent
Nagami et al.

(10) Patent No.: US 12,537,172 B2
(45) **Date of Patent: *Jan. 27, 2026**

(54) PLASMA PROCESSING METHOD AND PLASMA PROCESSING APPARATUS

(71) Applicant: Tokyo Electron Limited, Tokyo (JP)

(72) Inventors: Koichi Nagami, Miyagi (JP); Kazunobu Fujiwara, Miyagi (JP); Tatsuro Ohshita, Miyagi (JP); Takashi Dokan, Miyagi (JP); Koji Maruyama, Miyagi (JP); Kazuya Nagaseki, Miyagi (JP); Shinji Himori, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 310 days.

This patent is subject to a terminal disclaimer.

(21) Appl. No.: 17/495,908

(22) Filed: Oct. 7, 2021

(65) Prior Publication Data

US 2022/0028665 A1 Jan. 27, 2022

Related U.S. Application Data

(63) Continuation of application No. 16/722,248, filed on Dec. 20, 2019, now Pat. No. 11,170,979, which is a (Continued)

(30) Foreign Application Priority Data

Aug. 18, 2017 (JP) ................................ 2017-157832

(51) Int. Cl.
*H01J 37/32* (2006.01)

(52) U.S. Cl.
CPC ........ *H01J 37/32697* (2013.01); *H01J 37/32* (2013.01); *H01J 37/32128* (2013.01); (Continued)

(58) Field of Classification Search
None
See application file for complete search history.

(56) References Cited

U.S. PATENT DOCUMENTS 6,166,933 A * 12/2000 Bowers .................. H02M 1/34 363/56.05
6,231,777 B1 * 5/2001 Kofuji ............... H01J 37/32706 427/535

(Continued)

FOREIGN PATENT DOCUMENTS

CN 101499399 A 8/2009
CN 101685772 A 3/2010

(Continued)

OTHER PUBLICATIONS

Daintith, John Martin, Elizabeth. (2010). Dictionary of Science (6th Edition)—Transistor. (pp. 831-832). Oxford University Press (Year: 2010).*

*Primary Examiner* — Ram N Kackar
*Assistant Examiner* — Laureen Chan
(74) *Attorney, Agent, or Firm* — XSENSUS LLP

(57) ABSTRACT

A decrease of an etching rate of a substrate can be suppressed, and energy of ions irradiated to an inner wall of a chamber main body can be reduced. A plasma processing apparatus includes a DC power supply configured to generate a negative DC voltage to be applied to a lower electrode of a stage. In a plasma processing performed by using the plasma processing apparatus, a radio frequency power is supplied to generate plasma by exciting a gas within a chamber. Further, the negative DC voltage from the DC power supply is periodically applied to the lower electrode to attract ions in the plasma onto the substrate placed on the stage. A ratio occupied, within each of cycles, (Continued)

by a period during which the DC voltage is applied to the lower electrode is set to be equal to or less than 40%.

18 Claims, 14 Drawing Sheets

Related U.S. Application Data continuation of application No. 16/104,512, filed on Aug. 17, 2018, now Pat. No. 10,553,407.

(52) U.S. Cl.
CPC .. *H01J 37/32165* (2013.01); *H01J 37/32183* (2013.01); *H01J 37/32706* (2013.01); *H01J 37/32715* (2013.01); *H01J 37/32146* (2013.01); *H01J 2237/002* (2013.01); *H01J 2237/327* (2013.01); *H01J 2237/334* (2013.01)

(56) References Cited

U.S. PATENT DOCUMENTS

| | | | | |
|---|---|---|---|---|
| 2002/0115301 | A1 | 8/2002 | Savas | |
| 2002/0131286 | A1* | 9/2002 | Zametzky | H02M 1/088 363/132 |
| 2007/0065594 | A1 | 3/2007 | Chiang et al. | |
| 2008/0317965 | A1 | 12/2008 | Son et al. | |
| 2009/0029067 | A1 | 1/2009 | Sciamanna et al. | |
| 2009/0194508 | A1 | 8/2009 | Ui et al. | |
| 2010/0072172 | A1* | 3/2010 | Ui | H01J 37/321 156/345.48 |
| 2010/0213172 | A1* | 8/2010 | Wilson | H01J 37/32706 156/345.1 |
| 2010/0248488 | A1* | 9/2010 | Agarwal | H01J 37/32706 438/714 |
| 2011/0017139 | A1 | 1/2011 | Chiang et al. | |
| 2011/0031216 | A1* | 2/2011 | Liao | H01J 37/32082 216/67 |
| 2012/0228263 | A1* | 9/2012 | Ui | H01J 37/32146 156/345.44 |
| 2012/0247677 | A1* | 10/2012 | Himori | H01J 37/32091 156/345.44 |
| 2013/0092529 | A1 | 4/2013 | Singh et al. | |
| 2013/0105443 | A1* | 5/2013 | Banna | H01J 37/32165 216/67 |
| 2014/0262755 | A1 | 9/2014 | Deshmukh et al. | |
| 2016/0240353 | A1* | 8/2016 | Nagami | H01J 37/32577 |
| 2017/0099722 | A1 | 4/2017 | Kawasaki et al. | |
| 2017/0186586 | A1 | 6/2017 | Oh et al. | |
| 2018/0286636 | A1* | 10/2018 | Ziemba | H01J 37/241 |

FOREIGN PATENT DOCUMENTS

| | | | |
|---|---|---|---|
| CN | 105122431 | A | 12/2015 |
| JP | 2010-103465 | A | 5/2010 |
| JP | 2011-228694 | A | 11/2011 |
| JP | 2011-252193 | A | 12/2011 |
| JP | 2012-018890 | A | 1/2012 |
| JP | 2012-216608 | A | 11/2012 |
| JP | 2016-511551 | A | 4/2016 |
| KR | 10-0324792 | B1 | 6/2002 |
| KR | 10-2008-0020463 | A | 3/2008 |
| KR | 10-2010-0034703 | A | 4/2010 |
| KR | 10-2016-0100840 | A | 8/2016 |
| WO | 2014/159144 | A1 | 10/2014 |
| WO | 2014/164300 | A | 10/2014 |

* cited by examiner

PLASMA PROCESSING METHOD AND PLASMA PROCESSING APPARATUS

CROSS-REFERENCE TO RELATED APPLICATION

This is a continuation application of U.S. patent application Ser. No. 16/722,248 filed on Dec. 20, 2019, which is a continuation application of U.S. Ser. No. 16/104,512 filed on Aug. 17, 2018, now issued as U.S. Pat. No. 10,553,407, which claims the benefit of Japanese Patent Application No. 2017-157832 filed on Aug. 18, 2017, the entire disclosures of which are incorporated herein by reference.

TECHNICAL FIELD

The various aspects and embodiments described herein pertain generally to a plasma processing method and a plasma processing apparatus.

BACKGROUND

In the manufacture of an electronic device, a plasma processing apparatus is used. The plasma processing apparatus is generally equipped with a chamber main body, a stage and a radio frequency power supply. An internal space of the chamber main body is configured as a chamber. The chamber main body is grounded. The stage is provided within the chamber and configured to support a substrate placed thereon. The stage includes a lower electrode. The radio frequency power supply is configured to supply a radio frequency power to excite a gas within the chamber. In this plasma processing apparatus, ions are accelerated by a potential difference between a potential of the lower electrode and a potential of the plasma, and the accelerated ions are irradiated to the substrate.

In the plasma processing apparatus, a potential difference is also generated between the chamber main body and the plasma. When the potential difference between the chamber main body and the plasma is large, energy of ions irradiated to an inner wall of the chamber main body is increased, so that particles are released from the chamber main body. The particles released from the chamber main body contaminates the substrate placed on the stage. To suppress the generation of these particles, Patent Document 1 discloses a technique using an adjustment mechanism configured to adjust a ground capacity of the chamber. The adjustment mechanism described in Patent Document 1 is configured to adjust an area ratio between a cathode and an anode facing the chamber, that is, an A/C ratio.

Patent Document 1: Japanese Patent Laid-open Publication No. 2011-228694

SUMMARY

As one kind of the plasma processing apparatus, there is used a plasma processing apparatus configured to supply a radio frequency power for bias ("radio frequency bias power") to the lower electrode. The radio frequency bias power is supplied to the lower electrode to increase an etching rate of the substrate by increasing the energy of the ions irradiated to the substrate. In this plasma processing apparatus, if the potential of the plasma is increased, the potential difference between the plasma and the chamber main body is increased, and the energy of the ions irradiated to the inner wall of the chamber main body is also increased. In this regard, it is required to suppress a decrease of the etching rate of the substrate and reduce the energy of the ions irradiated to the inner wall of the chamber main body.

In one exemplary embodiment, there is provided a plasma processing method performed in a plasma processing apparatus. The plasma processing apparatus includes a chamber main body, a stage, a radio frequency power supply and one or more DC power supplies. An internal space of the chamber main body is configured as a chamber. The stage is provided within the chamber main body. The stage includes a lower electrode. The stage is configured to support a substrate placed thereon. The radio frequency power supply is configured to supply a radio frequency power for exciting a gas supplied into the chamber. The one or more DC power supplies are configured to generate a negative DC voltage to be applied to the lower electrode. The plasma processing method includes (i) supplying the radio frequency power from the radio frequency power supply to generate plasma of the gas supplied into the chamber; and (ii) applying the negative DC voltage to the lower electrode from the one or more DC power supplies to attract ions in the plasma onto the substrate. In the applying of the DC voltage, the DC voltage is applied to the lower electrode periodically, and a ratio occupied, within each of cycles, by a period during which the DC voltage is applied to the lower electrode is set to be equal to or less than 40%.

Dependency of an etching rate of the substrate upon the ratio occupied, within each cycle, by the period during which the negative DC voltage is applied to the lower electrode, that is, a duty ratio is small. Meanwhile, when the duty ratio is small, particularly, when the duty ratio is equal to or less than 40%, an etching rate of the chamber main body is greatly decreased. That is, energy of ions irradiated to an inner wall of the chamber main body is decreased. Thus, according to the plasma processing method of the present exemplary embodiment, a decrease of the etching rate of the substrate can be suppressed, and the energy of the ions irradiated to the inner wall of the chamber main body can be reduced.

The ratio, that is, the duty ratio is set to be equal to or less than 35%. According to the present exemplary embodiment, the energy of the ions irradiated to the inner wall of the chamber main body can be further reduced.

The plasma processing apparatus includes multiple DC power supplies as the one or more DC power supplies. The DC voltage applied to the lower electrode within each of the cycles is generated by DC voltages outputted from the multiple DC power supplies in sequence. According to the present exemplary embodiment, a load of each of the multiple DC power supplies is reduced.

In the plasma processing method according to the present exemplary embodiment, the radio frequency power is supplied in the period during which the DC voltage is applied, and the supplying of the radio frequency power is stopped in a period during which the applying of the DC voltage is stopped. In the plasma processing method, the supply of the radio frequency power may be stopped in the period during which the DC voltage is applied, and the radio frequency power is supplied in a period during which the application of the DC voltage is stopped.

In another exemplary embodiment, there is provided a plasma processing apparatus. The plasma processing apparatus includes a chamber main body, a stage, a radio frequency power supply, one or more DC power supplies, a switching unit and a controller. An internal space of the chamber main body is configured as a chamber. The stage is provided within the chamber main body. The stage includes a lower electrode. The stage is configured to support a substrate placed thereon. The radio frequency power supply is configured to supply a radio frequency power for exciting a gas supplied into the chamber. The one or more DC power supplies are configured to generate a negative DC voltage to be applied to the lower electrode. The switching unit is configured to allow the application of the DC voltage to the lower electrode to be stopped. The controller is configured to control the switching unit. The controller controls the switching unit such that the negative DC voltage from the one or more DC power supplies is applied to the lower electrode periodically to attract ions in plasma of a gas generated within the chamber onto the substrate, and such that a ratio occupied, within each of cycles, by a period during which the DC voltage is applied to the lower electrode is set to be equal to or less than 40%.

The controller may control the switching unit such that the ratio, that is, the duty ratio is set to be equal to or less than 35%.

The plasma processing apparatus further includes multiple DC power supplies as the one or more DC power supplies. The controller controls the switching unit such that the DC voltage applied to the lower electrode within each of the cycles is generated by DC voltages outputted from the multiple DC power supplies in sequence.

The controller controls the radio frequency power supply such that the radio frequency power is supplied in the period during which the DC voltage is applied, and the supply of the radio frequency power is stopped in a period during which the application of the DC voltage is stopped. The controller may control the radio frequency power supply such that the supply of the radio frequency power is stopped in the period during which the DC voltage is applied, and the radio frequency power is supplied in a period during which the application of the DC voltage is stopped.

As described above, it is possible to suppress the decrease of the etching rate of the substrate and reduce the energy of the ions irradiated to the inner wall of the chamber main body.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
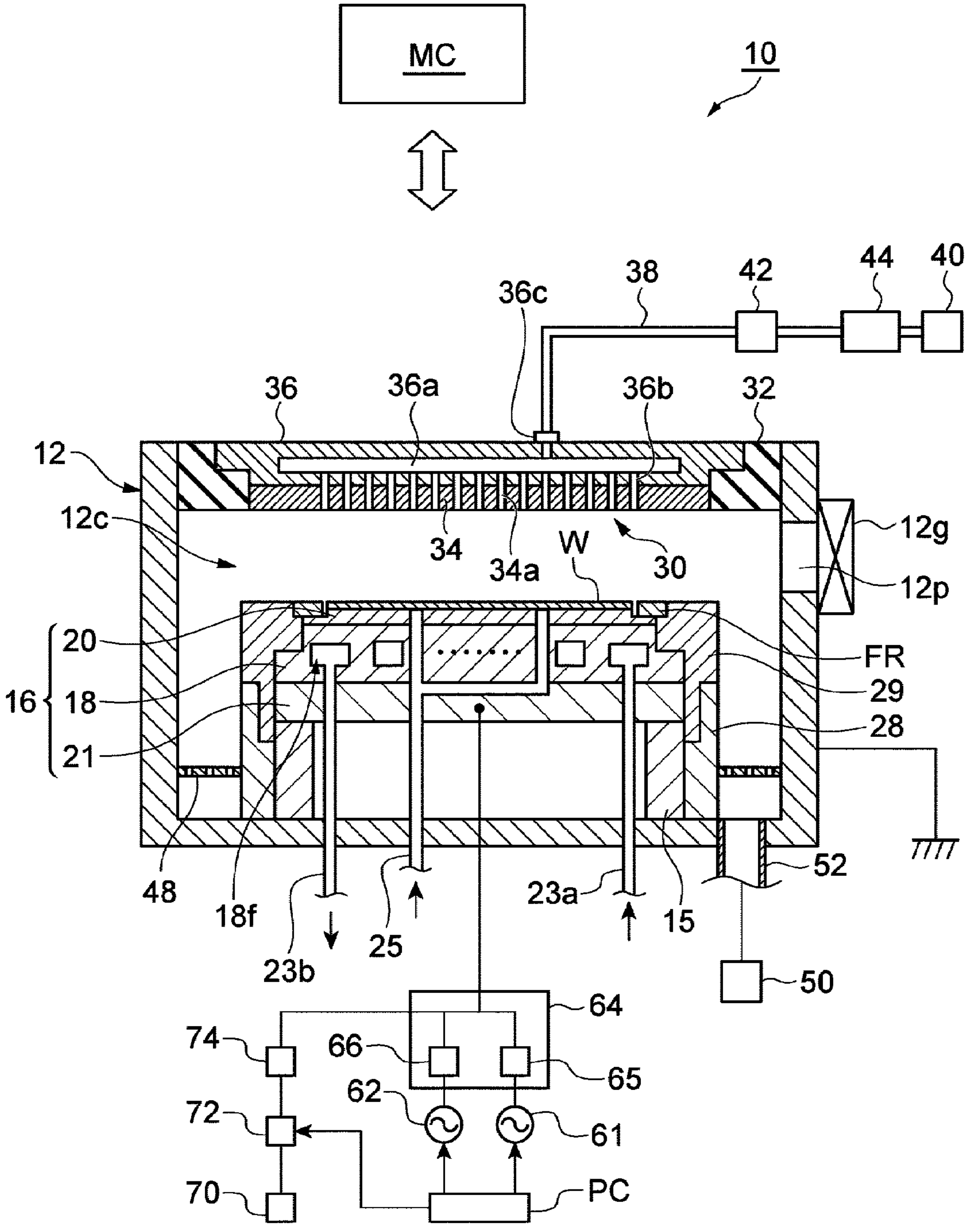
FIG. 1 is a diagram schematically illustrating a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the various drawings, same or corresponding parts will be assigned same reference numerals.

Figure 2:
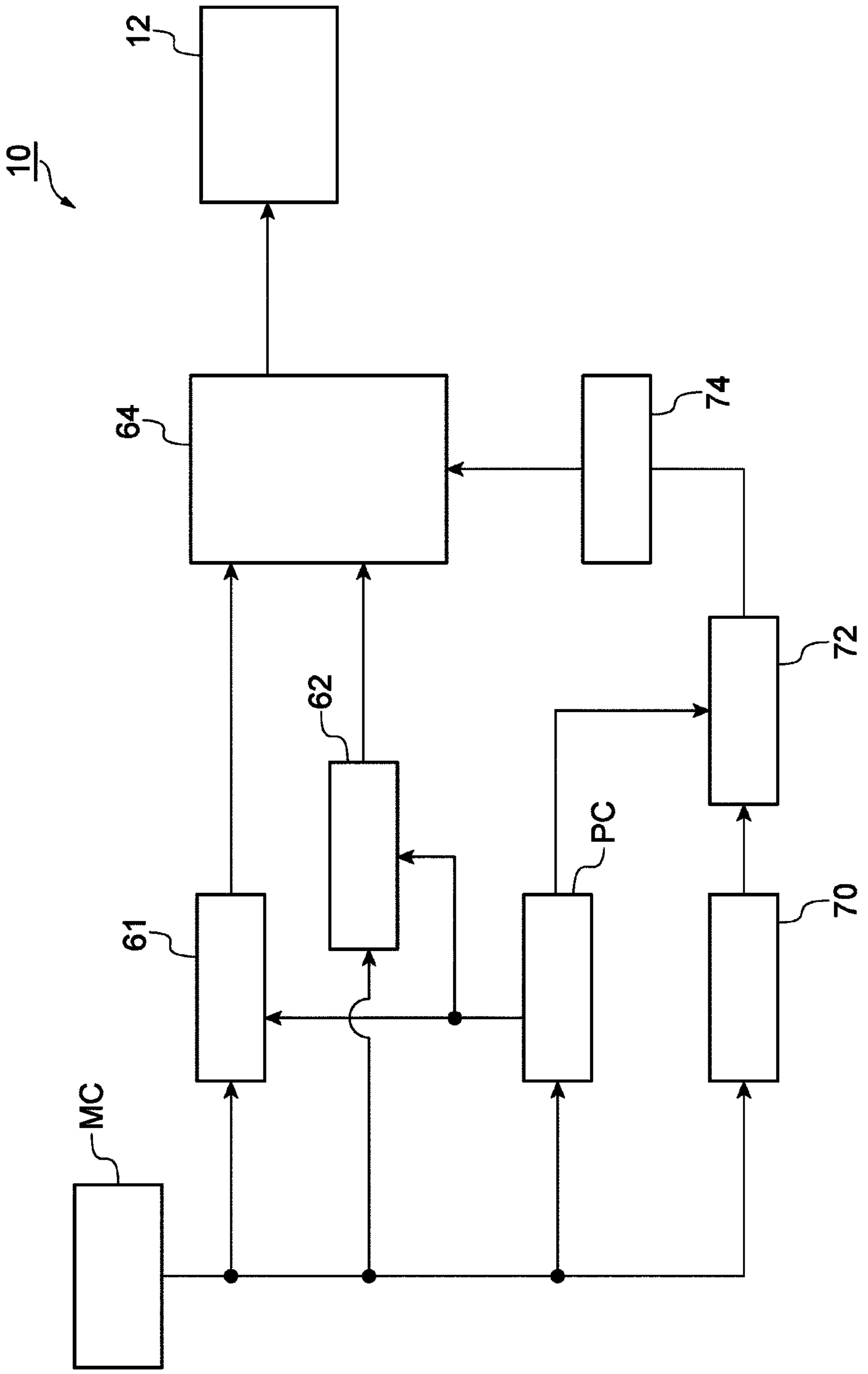
FIG. 2 is a diagram illustrating a power supply system and a control system of the plasma processing apparatus shown in FIG. 1.

FIG. 1 is a diagram schematically illustrating a plasma processing apparatus according to an exemplary embodiment. FIG. 2 is a diagram illustrating a power supply system and a control system of the plasma processing apparatus shown in FIG. 1. A plasma processing apparatus 10 shown in FIG. 1 is configured as a capacitively coupled plasma processing apparatus.

The plasma processing apparatus 10 is equipped with a chamber main body 12. The chamber main body 12 has a substantially cylindrical shape. An internal space of the chamber main body 12 is configured as a chamber 12*c*. The chamber main body 12 is made of, by way of example, but not limited to, aluminum. The chamber main body 12 is connected to the ground potential. A plasma-resistant film is formed on an inner wall surface of the chamber main body 12, that is, on a wall surface confining the chamber 12*c*. This film may be a film formed by anodic oxidation or a film made of ceramic such as yttrium oxide. Further, a passage 12*p* is formed at a sidewall of the chamber main body 12. When a substrate W is carried into the chamber 12*c* or carried out of the chamber 12*c*, the substrate W passes through this passage 12*p*. A gate valve 12*g* is provided along the sidewall of the chamber main body 12 to open/close this passage 12*p*.

Within the chamber 12*c*, a supporting member 15 is upwardly extended from a bottom of the chamber main body 12. The supporting member 15 has a substantially cylindrical shape and is made of an insulating material such as ceramic. A stage 16 is mounted on the supporting member 15. The stage 16 is supported by the supporting member 15. The stage 16 is configured to support the substrate W within the chamber 12*c*. The stage 16 includes a lower electrode 18 and an electrostatic chuck 20. In the exemplary embodiment, the stage 16 further includes an electrode plate 21. The electrode plate 21 is made of a conductive material such as aluminum and has a substantially disk shape. The lower electrode 18 is provided on the electrode plate 21. The lower electrode 18 is made of a conductive material such as, but not limited to, aluminum and has a substantially disk shape. The lower electrode 18 is electrically connected with the electrode plate 21.

A path 18*f* is formed within the lower electrode 18. The path 18*f* is a passage for a heat exchange medium. A liquid coolant or a coolant (for example, Freon) which cools the lower electrode 18 by being vaporized is used as the heat exchange medium. The heat exchange medium is supplied via a pipeline 23*a* into the path 18*f* from a chiller unit provide at an outside of the chamber main body 12. The heat exchange medium supplied into the path 18*f* is returned back into the chiller unit via a pipeline 23*b*. That is, the heat exchange medium is supplied into the path 18*f* to be circulated between the path 18*f* and the chiller unit.

The electrostatic chuck 20 is provided on the lower electrode 18. The electrostatic chuck 20 has a main body made of an insulator and a film-shaped electrode provided within the main body. The electrode of the electrostatic chuck 20 is electrically connected with a DC power supply. If a voltage is applied to the electrode of the electrostatic chuck 20 from the DC power supply, an electrostatic attractive force is generated between the electrostatic chuck 20 and the substrate W placed thereon. The substrate W is attracted to and held by the electrostatic chuck 20 by the generated electrostatic attractive force. A focus ring FR is provided on a peripheral portion of the electrostatic chuck 20. The focus ring FR has a substantially annular plate shape and is made of, by way of non-limiting example, silicon. The focus ring FR is provided to surround an edge of the substrate W.

The plasma processing apparatus 10 is equipped with a gas supply line 25. Through the gas supply line 25, a heat transfer gas, for example, a He gas from a gas supply mechanism is supplied into a gap between a top surface of the electrostatic chuck 20 and a rear surface (bottom surface) of the substrate W.

A cylindrical member 28 is extended upwards from the bottom of the chamber main body 12. The cylindrical member 28 is extended along an outer circumferential surface of the supporting member 15. The cylindrical member 28 is made of a conductive material and has a substantially cylindrical shape. The cylindrical member 28 is connected to the ground potential. An insulating member 29 is provided on the cylindrical member 28. The insulating member 29 has insulation property and is made of, by way of non-limiting example, quartz or ceramic. The insulating member 29 is extended along an outer circumferential surface of the stage 16.

The plasma processing apparatus 10 is further equipped with an upper electrode 30. The upper electrode 30 is disposed above the stage 16. The upper electrode 30 closes a top opening of the chamber main body 12 along with a member 32. The member 32 has insulation property. The upper electrode 30 is supported at an upper portion of the chamber main body 12 with the member 32 therebetween. If a first radio frequency power supply 61 to be described later is electrically connected to the lower electrode 18, this upper electrode 30 is connected to the ground potential.

The upper electrode 30 includes a ceiling plate 34 and a supporting body 36. A bottom surface of the ceiling plate 34 forms and confines the chamber 12*c*. The ceiling plate 34 is provided with a multiple number of gas discharge holes 34*a*. Each of these gas discharge holes 34*a* is formed through the ceiling plate 34 in a plate thickness direction thereof (vertical direction). This ceiling plate 34 may be made of, by way of example, but not limitation, silicon. Alternatively, the ceiling plate 34 may have a structure in which a plasma-resistant film is formed on a surface of a base member made of aluminum. This film may be one formed by anodic oxidation or one made of ceramic such as yttrium oxide.

The supporting body 36 is configured to support the ceiling plate 34 in a detachable manner, and is made of a conductive material such as, but not limited to, aluminum. A gas diffusion space 36*a* is formed within the supporting body 36. A multiple number of gas holes 36*b* are extended downwards from the gas diffusion space 36*a* to communicate with the gas discharge holes 34*a*, respectively. Further, the supporting body 36 is provided with a gas inlet port 36*c* through which a gas is introduced into the gas diffusion space 36*a*, and a gas supply line 38 is connected to this gas inlet port 36*c*.

The gas supply line 38 is connected to a gas source group 40 via a valve group 42 and a flow rate controller group 44. The gas source group 40 includes a plurality of gas sources. The valve group 42 includes a plurality of valves, and the flow rate controller group 44 includes a plurality of flow rate controllers. Each of the flow rate controllers belonging to the flow rate controller group 44 may be implemented by a mass flow controller or a pressure control type flow rate controller. Each of the gas sources belonging the gas source group 40 is connected to the gas supply line 38 via a corresponding valve belonging to the valve group 42 and a corresponding flow rate controller belonging to the flow rate controller group 44. The plasma processing apparatus 10 is capable of supplying gases from one or more gas sources selected from the plurality of gas sources belonging to the gas source group 40 into the chamber 12*c* at individually controlled flow rates.

A baffle plate 48 is provided between the cylindrical member 28 and the sidewall of the chamber main body 12.

By way of non-limiting example, the baffle plate 48 may be made of an aluminum base member coated with ceramic such as yttrium oxide. This baffle plate 48 is provided with a multiple number of through holes. Under the baffle plate 48, a gas exhaust pipe 52 is connected to the bottom of the chamber main body 12. The gas exhaust pipe 52 is connected to a gas exhaust device 50. The gas exhaust device 50 has a pressure controller such as an automatic pressure control valve and a vacuum pump such as a turbo molecular pump, and is configured to decompress the chamber 12*c*.

As depicted in FIG. 1 and FIG. 2, the plasma processing apparatus 10 is further equipped with the first radio frequency power supply 61. The first radio frequency power supply 61 is configured to generate a first radio frequency power for plasma generation by exciting a gas within the chamber 12*c*. The first radio frequency power has a frequency ranging from 27 MHz to 100 MHz, for example, 60 MHz. The first radio frequency power supply 61 is connected to the lower electrode 18 via a first matching circuit 65 of a matching device 64 and the electrode plate 21. The first matching circuit 65 is configured to match an output impedance of the first radio frequency power supply 61 and an impedance at a load side (lower electrode 18 side). Further, the first radio frequency power supply 61 may not be electrically connected to the lower electrode 18 but be connected to the upper electrode 30 via the first matching circuit 65.

The plasma processing apparatus 10 is further equipped with a second radio frequency power supply 62. The second radio frequency power supply 62 is configured to generate a second radio frequency power for ion attraction into the substrate W. A frequency of the second radio frequency power is lower than the frequency of the first radio frequency power and falls within a range from 400 kHz to 13.56 MHz, for example, 400 kHz. The second radio frequency power supply 62 is connected to the lower electrode 18 via a second matching circuit 66 of the matching device 64 and the electrode plate 21. The second matching circuit 66 is configured to match an output impedance of the second radio frequency power supply 62 and the impedance at the load side (lower electrode 18 side).

The plasma processing apparatus 10 is further equipped with a DC power supply 70 and a switching unit 72. The DC power supply 70 is configured to generate a negative DC voltage. The negative DC voltage is applied as a bias voltage for attracting ions into the substrate W placed on the stage 16. The DC power supply 70 is connected to the switching unit 72. The switching unit 72 is electrically connected with the lower electrode 18 via a radio frequency filter 74. In the plasma processing apparatus 10, one of the DC voltage generated by the DC power supply 70 and the second radio frequency power generated by the second radio frequency power supply 62 is selectively supplied to the lower electrode 18.

The plasma processing apparatus 10 is further equipped with a controller PC. The controller PC is configured to control the switching unit 72. The controller PC may be further configured to control either one or both of the first and second radio frequency power supplies 61 and 62.

In the exemplary embodiment, the plasma processing apparatus 10 may further include a main control unit MC. The main control unit MC is implemented by a computer including a processor, a storage device, an input device, a display device, and so forth, and controls individual components of the plasma processing apparatus 10. To elaborate, the main control unit MC executes a control program stored in the storage device and controls the individual components of the plasma processing apparatus 10 based on recipe data stored in the storage device. Under this control, the plasma processing apparatus 10 performs a process designated by the recipe data.

Figure 3:
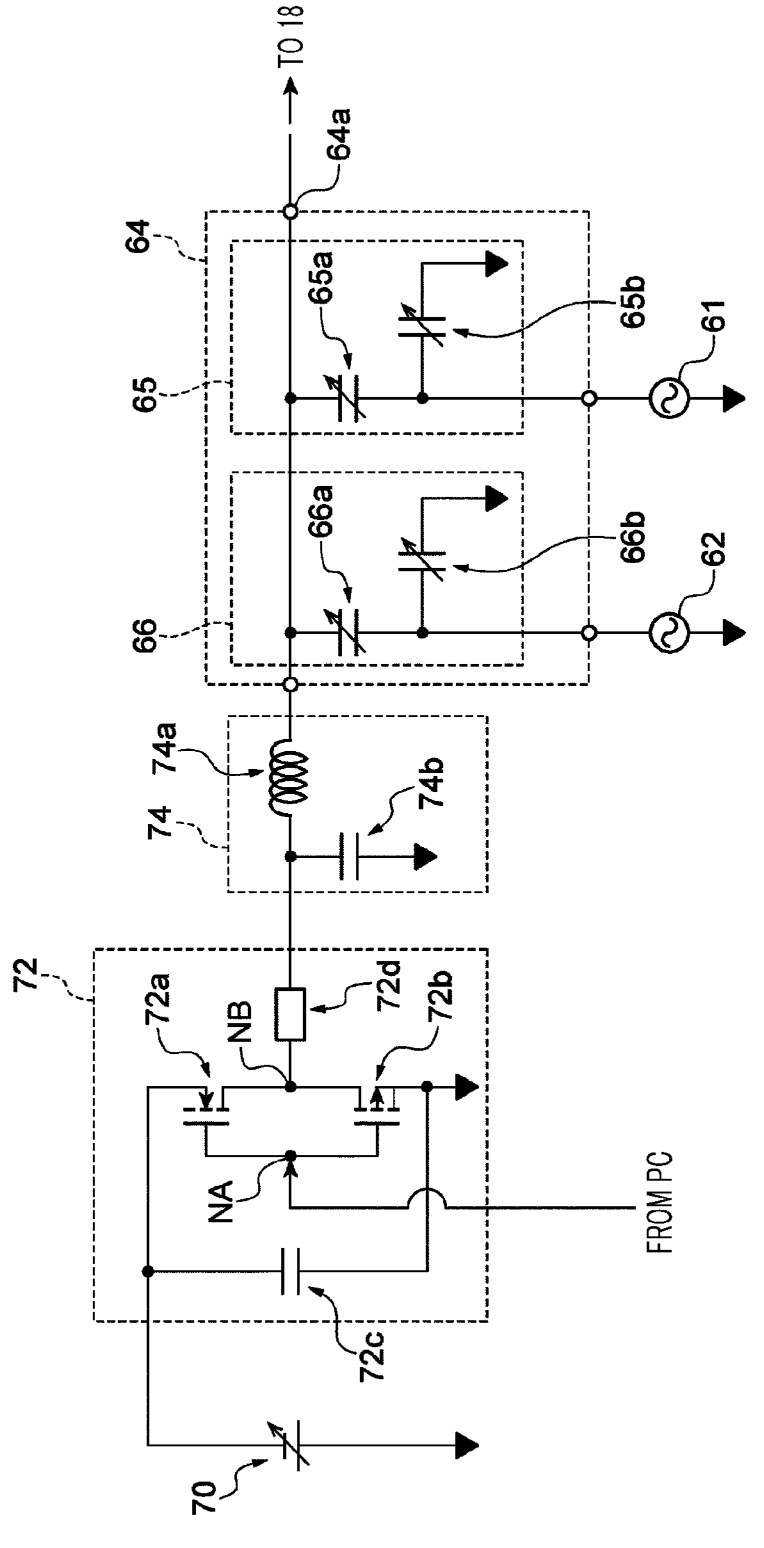
FIG. 3 is a diagram illustrating a circuit configuration of a DC power supply, a switching unit, a radio frequency filter and a matching device shown in FIG. 2.

Now, reference is made of FIG. 2 and FIG. 3. FIG. 3 is a diagram illustrating a circuit configuration of the DC power supply, the switching unit, the radio frequency filter and the matching device. The DC power supply 70 is a variable DC power supply and is configured to generate a negative DC voltage to be applied to the lower electrode 18.

The switching unit 72 is configured to stop the application of the DC voltage to the lower electrode 18 from the DC power supply 70. In the exemplary embodiment, the switching unit 72 includes field effect transistors (a FET 72*a* and a FET 72*b*), a capacitor 72*c* and a resistor element 72*d*. The FET 72*a* may be, by way of example, a N-channel MOSFET. The FET 72*b* may be, by way of example, a P-channel MOSFET. A source of the FET 72*a* is connected to a cathode of the DC power supply 70. One end of the capacitor 72*c* is connected to the cathode of the DC power supply 70 and the source of the FET 72*a*. The other end of the capacitor 72*c* is connected to a source of the FET 72*b*. The source of the FET 72*b* is connected to the ground. A gate of the FET 72*a* and a gate of the FET 72*b* are connected to each other. A pulse control signal from the controller PC is supplied to a node NA connected between the gate of the FET 72*a* and the gate of the FET 72*b*. A drain of the FET 72*a* is connected to a drain of the FET 72*b*. A node NB connected to the drain of the FET 72*a* and the drain of the FET 72*b* is connected to the radio frequency filter 74 via the resistor element 72*d*.

The radio frequency filter 74 is a filter configured to reduce or block a radio frequency power. According to the exemplary embodiment, the radio frequency filter 74 has an inductor 74*a* and a capacitor 74*b*. One end of the inductor 74*a* is connected to the resistor element 72*d*. The one end of the inductor 74*a* is connected with one end of the capacitor 74*b*. The other end of the capacitor 74*b* is connected to the ground. The other end of the inductor 74*a* is connected to the matching device 64.

The matching device 64 is equipped with the first matching circuit 65 and the second matching circuit 66. In the exemplary embodiment, the first matching circuit 65 has a variable capacitor 65*a* and a variable capacitor 65*b*, and the second matching circuit 66 has a variable capacitor 66*a* and a variable capacitor 66*b*. One end of the variable capacitor 65*a* is connected to the other end of the inductor 74*a*. The other end of the variable capacitor 65*a* is connected to the first radio frequency power supply 61 and one end of the variable capacitor 65*b*. The other end of the variable capacitor 65*b* is connected to the ground. One end of the variable capacitor 66*a* is connected to the other end of the inductor 74*a*. The other end of the variable capacitor 66*a* is connected to the second radio frequency power supply 62 and one end of the variable capacitor 66*b*. The other end of the variable capacitor 66*b* is connected to the ground. The one end of the variable capacitor 65*a* and the one end of the variable capacitor 66*a* are connected to a terminal 64*a* of the matching device 64. The terminal 64*a* of the matching device 64 is connected to the lower electrode 18 via the electrode plate 21.

Figure 4:
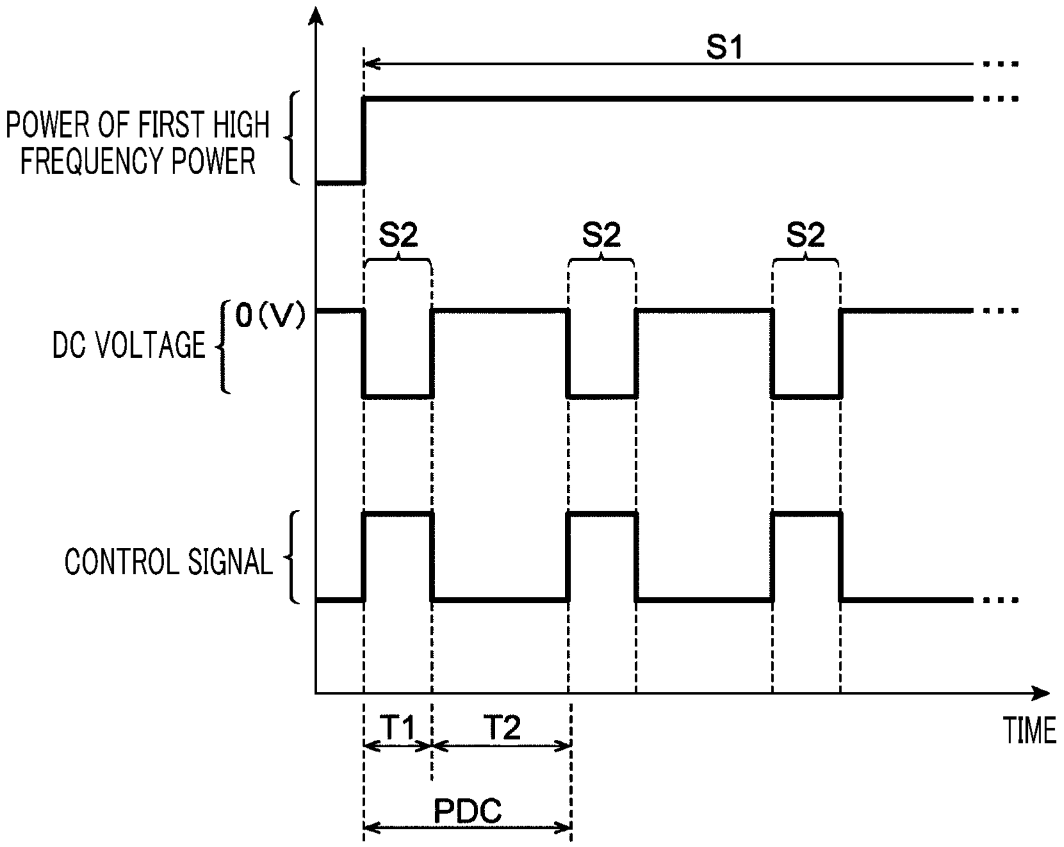
FIG. 4 is a timing chart for a plasma processing method according to an exemplary embodiment performed by using the plasma processing apparatus shown in FIG. 1.

Now, a control by the main control unit MC and the controller PC will be explained. In the following description, reference is made to FIG. 2 and FIG. 4. FIG. 4 is a timing chart for a plasma processing method according to an exemplary embodiment performed by using the plasma processing apparatus shown in FIG. 1. In FIG. 4, a horizontal axis represents time, and a vertical axis indicates a power of the first radio frequency power, the DC voltage applied to the lower electrode 18 from the DC power supply 70, and the control signal outputted by the controller PC. In FIG. 4, a high level of the power of the first radio frequency power implies that the first radio frequency power is being supplied to generate plasma, and a low level of the first radio frequency power means that the supply of the first radio frequency power is stopped. Further, in FIG. 4, a low level of the DC voltage implies that the negative DC voltage is applied to the lower electrode 18 from the DC power supply 70, and 0 V of the DC voltage implies that the DC voltage is not applied to the lower electrode 18 from the DC power supply 70.

The main control unit MC designates the power and the frequency of the first radio frequency power to the first radio frequency power supply 61. In the present exemplary embodiment, the main control unit MC designates, to the first radio frequency power supply 61, a timing for starting the supply of the first radio frequency power and a timing for stopping the supply of the first radio frequency power. In a period during which the first radio frequency power is supplied by the first radio frequency power supply 61, the plasma of the gas within the chamber is generated. That is, in this period, there is performed a process S1 of supplying the radio frequency power from the radio frequency power supply to generate the plasma. Further, in the example of FIG. 4, the first radio frequency power is continuously supplied while the plasma processing method of the exemplary embodiment is being performed.

The main control unit MC designates, to the controller PC, a frequency which defines a cycle in which the negative DC voltage from the DC power supply 70 is applied to the lower electrode 18 and a duty ratio. The duty ratio is a percentage occupied, within a single cycle (PDC in FIG. 4), by a period (T1 in FIG. 4) during which the negative DC voltage from the DC power supply 70 is applied to the lower electrode 18. This duty ratio is set to be equal to or less than 40%. In the present exemplary embodiment, this duty ratio is set to be equal to or less than 35%.

The controller PC generates a control signal according to the frequency and the duty ratio designated by the main control unit MC. The control signal generated by the controller PC may be a pulse signal. As an example, as depicted in FIG. 4, the control signal generated by the controller PC has a high level in the period T1 and a low level in the period P2. The period T2 is a period except the period T1 within the single cycle PDC. Alternatively, the control signal generated by the controller PC may have a low level in the period T1 and a high level in the period T2.

According to the present exemplary embodiment, the control signal generated by the controller PC is applied to the node NA of the switching unit 72. If the control signal is received, in the period T1, the switching unit 72 connects the DC power supply 70 and the node NB, thus allowing the negative DC voltage from the DC power supply 70 to be applied to the lower electrode 18. Meanwhile, in the period T2, the switching unit 72 disconnects the DC power supply 70 and the node NB from each other to allow the negative DC voltage from the DC power supply 70 not to be applied to the lower electrode 18. Accordingly, as shown in FIG. 4, the negative DC voltage from the DC power supply 70 is applied to the lower electrode 18 in the period T1, whereas the application of the negative DC voltage from the DC power supply 70 to the lower electrode 18 is stopped in the period T2. That is, in the plasma processing method according to the exemplary embodiment, there is performed a process S2 of applying the negative DC voltage from the DC power supply 70 to the lower electrode 18 periodically.

Figure 5A:
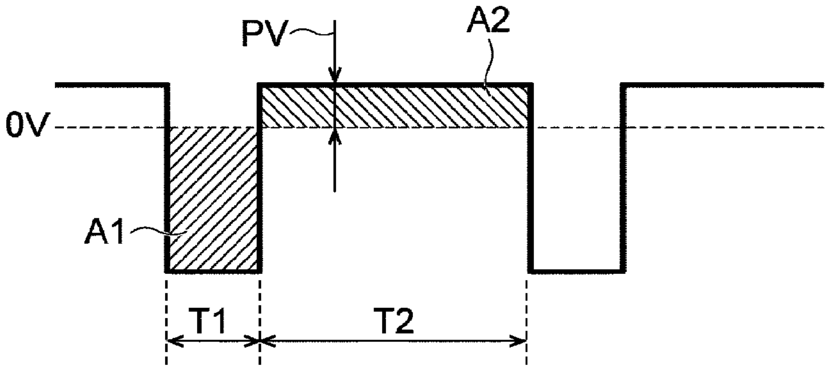
FIG. 5A and FIG. 5B are timing charts showing a plasma potential.
Figure 5B:
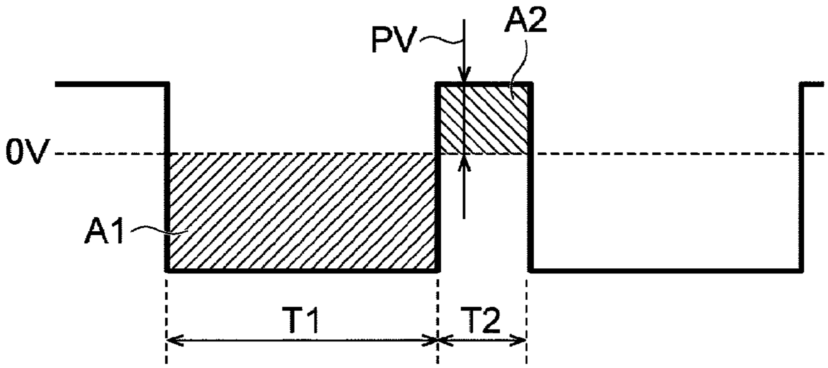

Here, reference is made to FIG. 5A and FIG. 5B. FIG. 5A and FIG. 5B are timing charts showing a plasma potential. In the period T1, since the negative DC voltage from the DC power supply 70 is applied to the lower electrode 18, positive ions in the plasma are moved toward the substrate W. Accordingly, as shown in FIG. 5A and FIG. 5B, the plasma potential is decreased in the period T1. Meanwhile, in the period T2, since the application of the negative DC voltage from the DC power supply 70 to the lower electrode 18 is stopped, movement of the positive ions is reduced, and electrons in the plasma move mainly. Accordingly, the plasma potential is increased in the period T2.

In the timing chart of FIG. 5A, the duty ratio is reduced as compared to the timing chart of FIG. 5B. If all conditions for generating the plasma are same, neither a total amount of the positive ions nor a total amount of the electrons in the plasma depends on the duty ratio. That is, a ratio between an area A1 and an area A2 in FIG. 5A is equal to a ratio between an area A1 and an area A2 in FIG. 5B. Therefore, if the duty ratio is small, a plasma potential PV in the period T2 is small.

Figure 6A:
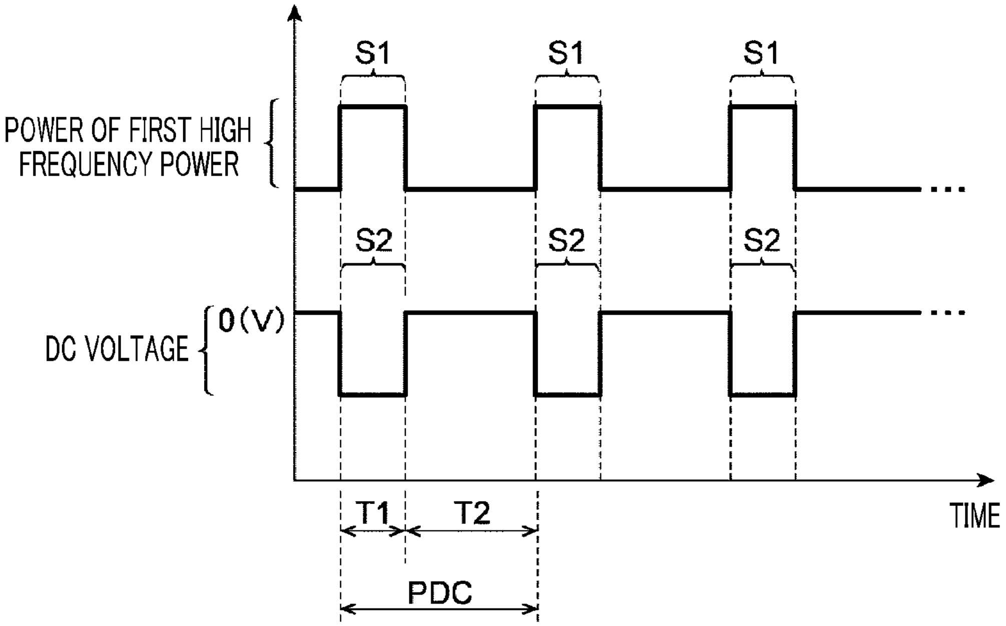
FIG. 6A and FIG. 6B are timing charts for a plasma processing method according to another exemplary embodiment.
Figure 6B:
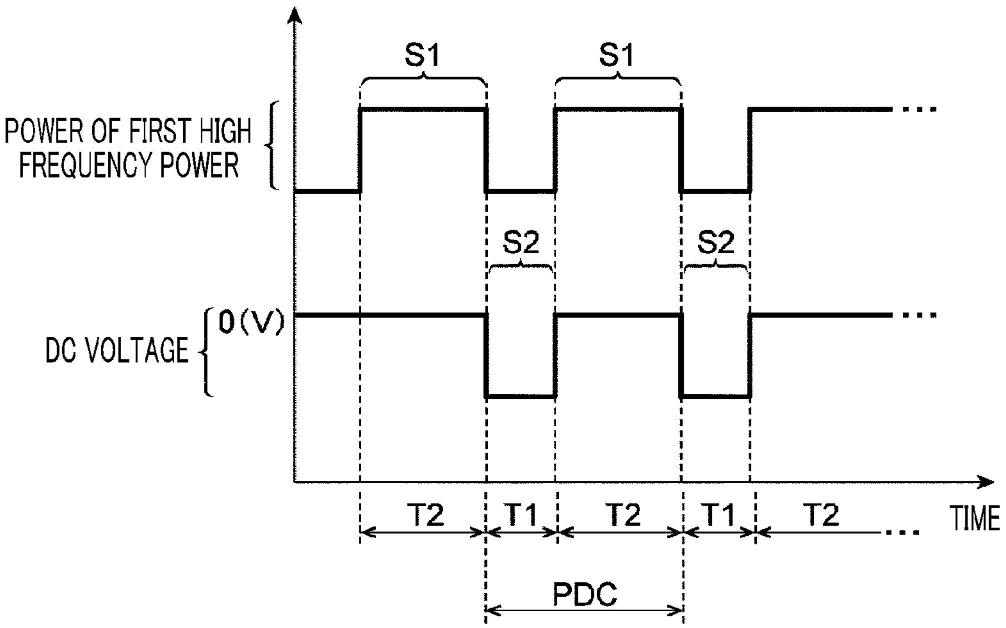

Dependency of an etching rate of the substrate W upon the duty ratio, that is, the ratio occupied, within each cycle PDC, by the period T1 during which the negative DC voltage is applied to the lower electrode 18 is small. Meanwhile, if the duty ratio is small, particularly, when the duty ratio is equal to or less than 40%, the plasma potential is decreased, so that the etching rate of the chamber main body 12 is greatly reduced. Accordingly, by setting the aforementioned duty ratio for the periodic application of the negative DC voltage to the lower electrode 18 to be equal to or less than 40%, the decrease of the etching rate of the substrate W can be suppressed, and the energy of the ions irradiated to the inner wall of the chamber main body 12 can be decreased. As a consequence, generation of particles from the chamber main body 12 is suppressed. Further, if the duty ratio is equal to or less than 35%, the energy of the ions irradiated to the inner wall of the chamber main body 12 can be further decreased Now, other exemplary embodiments will be explained. FIG. 6A and FIG. 6B are timing charts for a plasma processing method according to other exemplary embodiments. In each of FIG. 6A and FIG. 6B, a horizontal axis indicates a time, and a vertical axis indicates a power of the first radio frequency power and a DC voltage applied to the lower electrode 18 from the DC power supply 70. In each of FIG. 6A and FIG. 6B, a high level of the power of the first radio frequency power indicates that the first radio frequency power is being supplied for plasma generation, and a low level of the power of the first radio frequency power indicates that the supply of the first radio frequency power is stopped. Further, in each of FIG. 6A and FIG. 6B, a low level of the DC voltage implies that the negative DC voltage is being applied to the lower electrode 18 from the DC power supply 70, and 0 V of the DC voltage means that the DC voltage is not applied to the lower electrode 18 from the DC power supply 70.

In the exemplary embodiment shown in FIG. 6A, the negative DC voltage from the DC power supply 70 is periodically applied to the lower electrode 18, and the first radio frequency power is also supplied thereto periodically for the plasma generation. In the exemplary embodiment shown in FIG. 6A, the application of the negative DC voltage from the DC power supply 70 to the lower electrode 18 and the supply of the first radio frequency power are synchronized with each other. That is, the first radio frequency power is supplied in the period T1 during which the DC voltage from the DC power supply 70 is applied to the lower electrode 18, and the supply of the first radio frequency power is stopped in the period T2 during which the application of the DC voltage from the DC power supply 70 to the lower electrode 18 is stopped.

In the exemplary embodiment shown in FIG. 6B, the negative DC voltage from the DC power supply 70 is periodically applied to the lower electrode 18, and the first radio frequency power is also supplied thereto periodically for the plasma generation. In the exemplary embodiment shown in FIG. 6B, a phase of the supply of the first radio frequency power is reversed with respect to a phase of the application of the negative DC voltage from the DC power supply 70 to the lower electrode 18. That is, the supply of the first radio frequency power is stopped in the period T1 during which the DC voltage from the DC power supply 70 is applied to the lower electrode 18, and the first radio frequency power is supplied in the period T2 during which the application of the DC voltage from the DC power supply 70 to the lower electrode 18 is stopped.

In the exemplary embodiments shown in FIG. 6A and FIG. 6B, the aforementioned control signal from the controller PC is applied to the first radio frequency power supply 61. The first radio frequency power supply 61 starts the supply of the first radio frequency power at a timing when the control signal from the controller PC rises (or falls) and stops the supply of the first radio frequency power at a timing when the control signal from the controller PC falls (or rises). In the exemplary embodiments shown in FIG. 6A and FIG. 6B, generation of an unexpected radio frequency power caused by intermodulation distortion can be suppressed.

Figure 7:
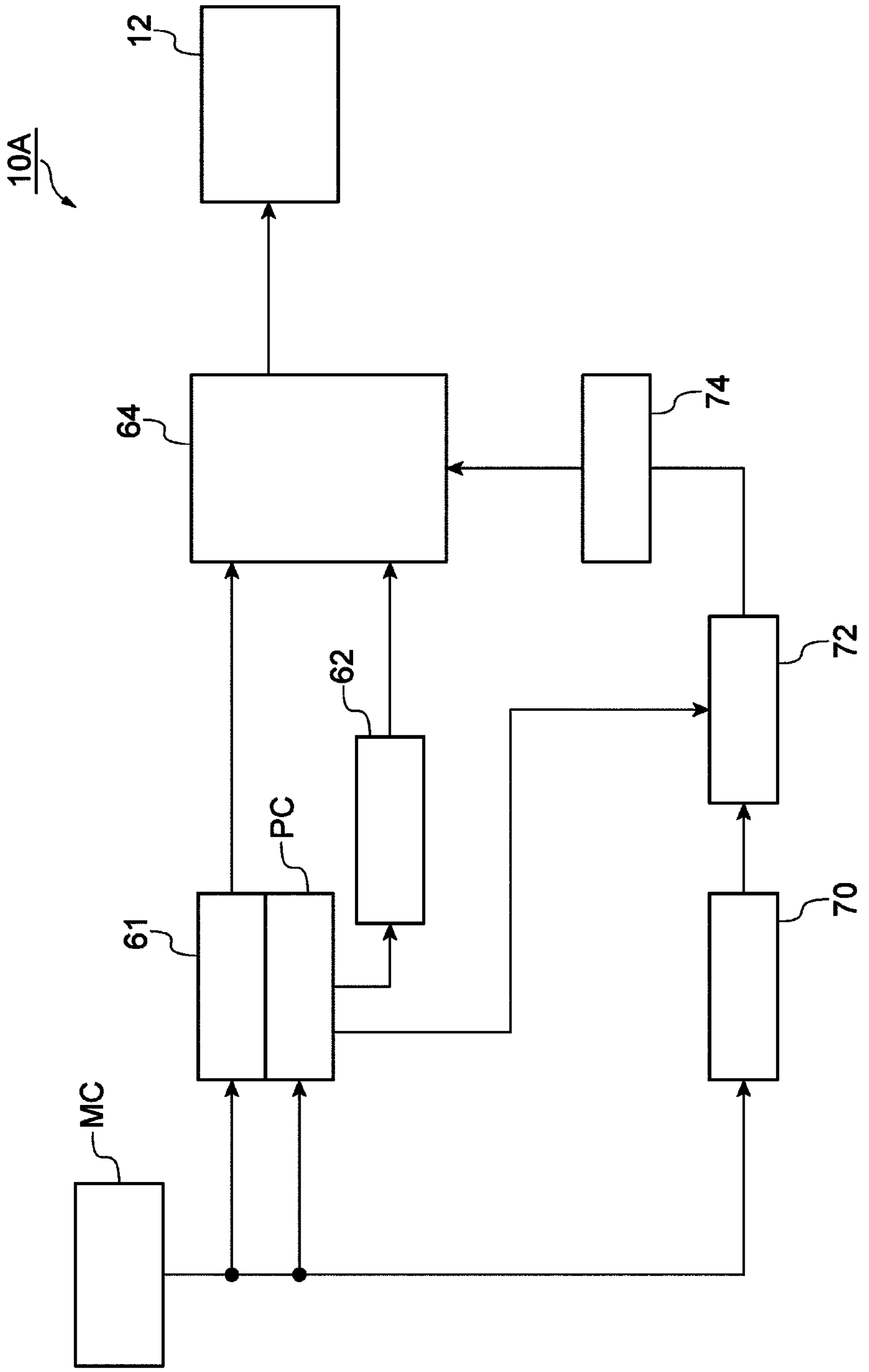
FIG. 7 is a diagram illustrating a power supply system and a control system of a plasma processing apparatus according to yet another exemplary embodiment.

Now, plasma processing apparatuses according to several other exemplary embodiments will be explained. FIG. 7 is a diagram illustrating a power supply system and a control system of a plasma processing apparatus according to another exemplary embodiment. As shown in FIG. 7, a plasma processing apparatus 10A according to the present exemplary embodiment is different from the plasma processing apparatus 10 in that the first radio frequency power 61 includes the controller PC. That is, in the plasma processing apparatus 10A, the controller PC is configured as a part of the first radio frequency power supply 61. Meanwhile, in the plasma processing apparatus 10, the controller PC is configured as a separate body from the first radio frequency power supply 61 and the second radio frequency power supply 62. Since, however, the controller PC is a part of the first radio frequency power supply 61 in the plasma processing apparatus 10A, the aforementioned control signal (pulse signal) from the controller PC is not sent to the first radio frequency power supply 61.

Figure 8:
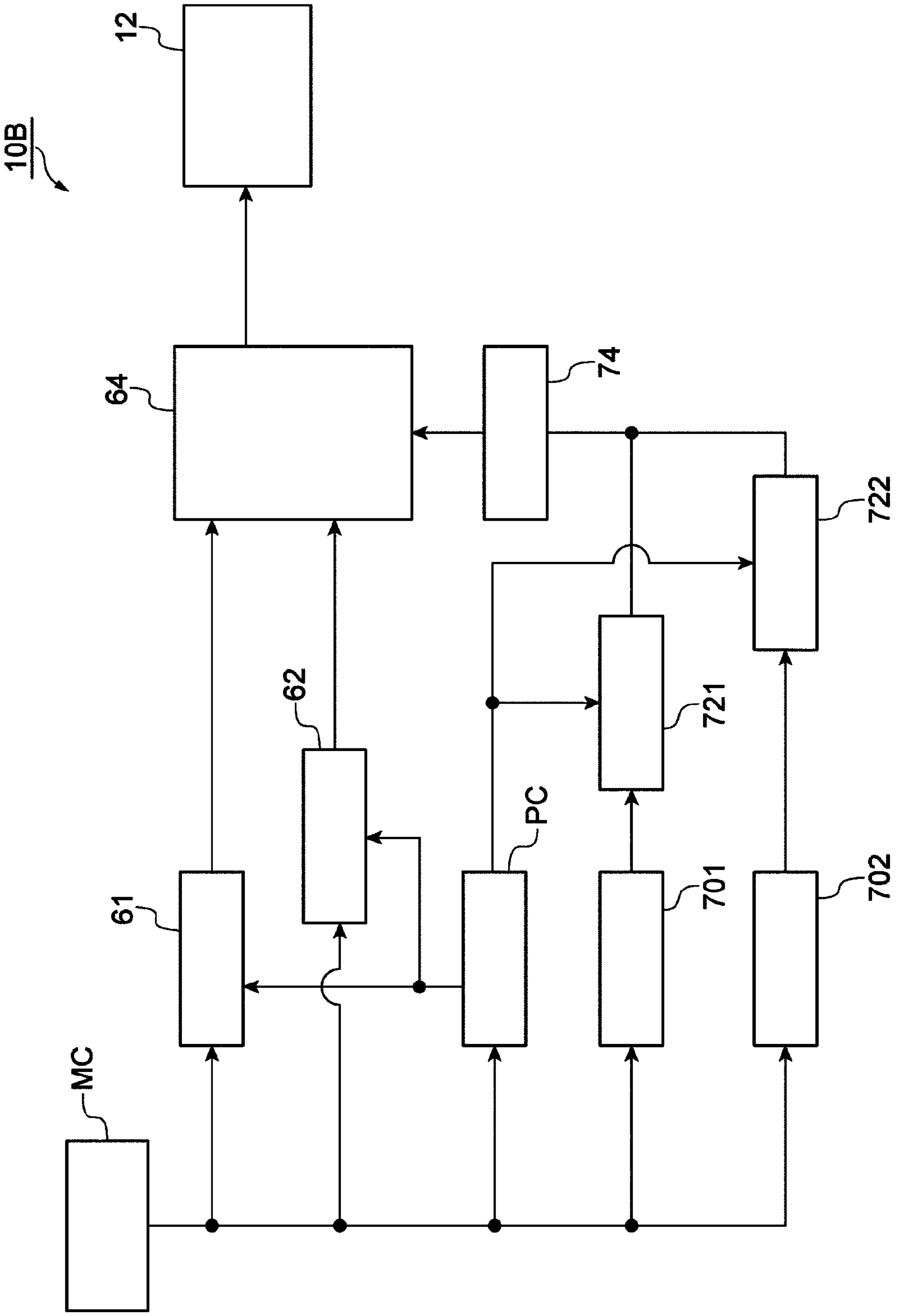
FIG. 8 is a diagram illustrating a power supply system and a control system of a plasma processing apparatus according to still yet another exemplary embodiment.

FIG. 8 is a diagram illustrating a power supply system and a control system of a plasma processing apparatus according to yet another exemplary embodiment. A plasma processing apparatus 10B shown in FIG. 8 is equipped with a plurality of DC power supplies 701 and 702 and a plurality of switching units 721 and 722. Each of the plurality of DC power supplies 701 and 702 is the same as the DC power supply 70 and configured to generate a negative DC voltage to be applied to the lower electrode 18. Each of the plurality of switching units 721 and 722 has the same configuration as the switching unit 72. The DC power supply 701 is connected to the switching unit 721. Like the switching unit 72, the switching unit 721 is capable of stopping the application of the DC voltage from the DC power supply 701 to the lower electrode 18. The DC power supply 702 is connected to the switching unit 722. Like the switching unit 72, the switching unit 722 is capable of stopping the application of the DC voltage from the DC power supply 702 to the lower electrode 18.

Figure 9:
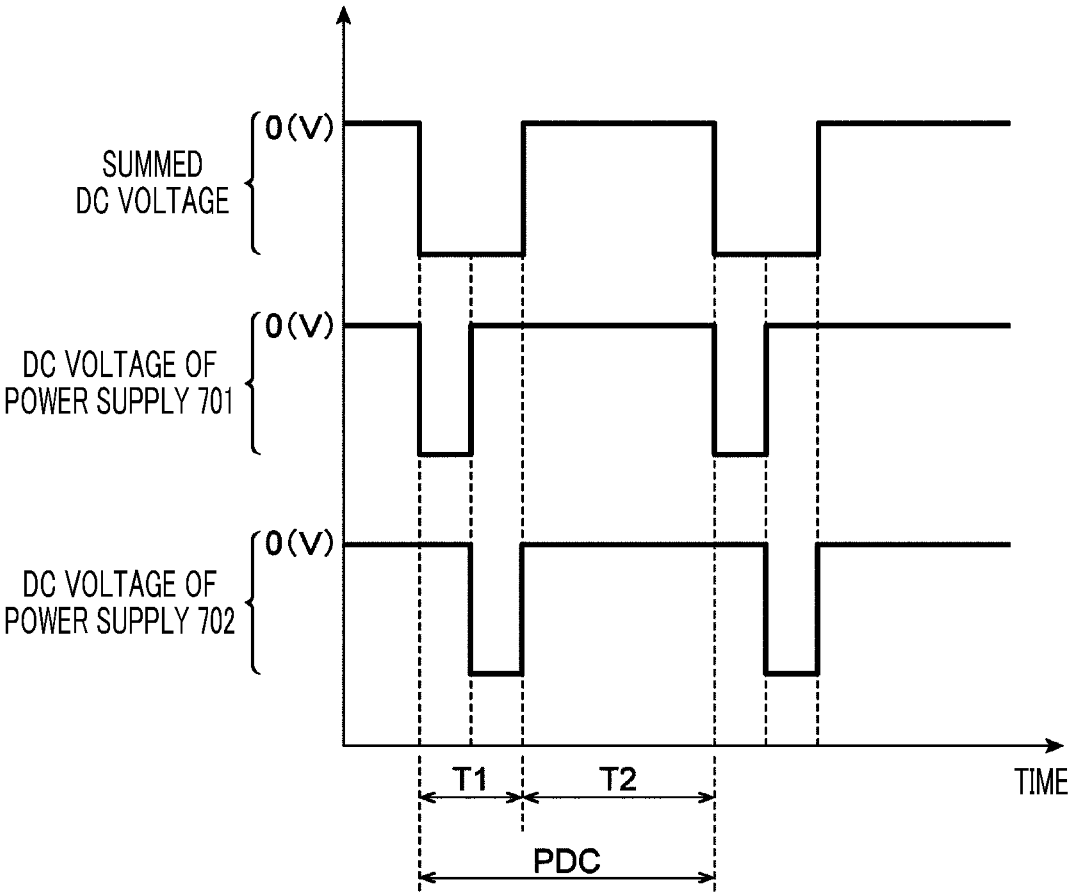
FIG. 9 is a timing chart for the plasma processing method according to an exemplary embodiment performed by using the plasma processing apparatus shown in FIG. 8.

FIG. 9 depicts a timing chart for a plasma processing method according to the yet another exemplary embodiment performed by using the plasma processing apparatus shown in FIG. 8. In FIG. 9, a horizontal axis represents a time, and a vertical axis indicates a summed DC voltage (that is, a DC voltage applied to the lower electrode 18), a DC voltage of the DC power supply 701 (that is, a DC voltage applied to the lower electrode from the DC power supply 701), and a DC voltage of the DC power supply 702 (that is, a DC voltage applied to the lower electrode from the DC power supply 702). As illustrated in FIG. 9, in the plasma processing apparatus 10B, a DC voltage applied to the lower electrode 18 within each cycle PDC is generated by a plurality of DC voltages outputted from the plurality of DC power supplies 701 and 702 in sequence. That is, in the plasma processing apparatus 10B, the DC voltage applied to the lower electrode 18 within each cycle PDC is generated by a temporal sum of the plurality of DC voltages outputted from the plurality of DC power supplies 701 and 702 in sequence. According to this plasma processing apparatus 10B, a load of each of the plurality of DC power supplies 701 and 702 is reduced.

In the plasma processing apparatus 10B, the controller PC outputs, to the switching unit 721, a control signal having a high level (or a low level) in a period during which the DC voltage from the DC power supply 701 is applied to the lower electrode 18 and a low level (or a high level) in a period during which the DC voltage from the DC power supply 701 is not applied to the lower electrode 18. Further, the controller PC outputs, to the switching unit 722, a control signal having a high level (or a low level) in a period during which the DC voltage from the DC power supply 702 is applied to the lower electrode 18 and a low level (or a high level) in a period during which the DC voltage from the DC power supply 702 is not applied to the lower electrode 18. That is, the controls signals (pulse signals) having different phases are respectively applied to the plurality of switching units connected to the plurality of DC power supplies.

Figure 10:
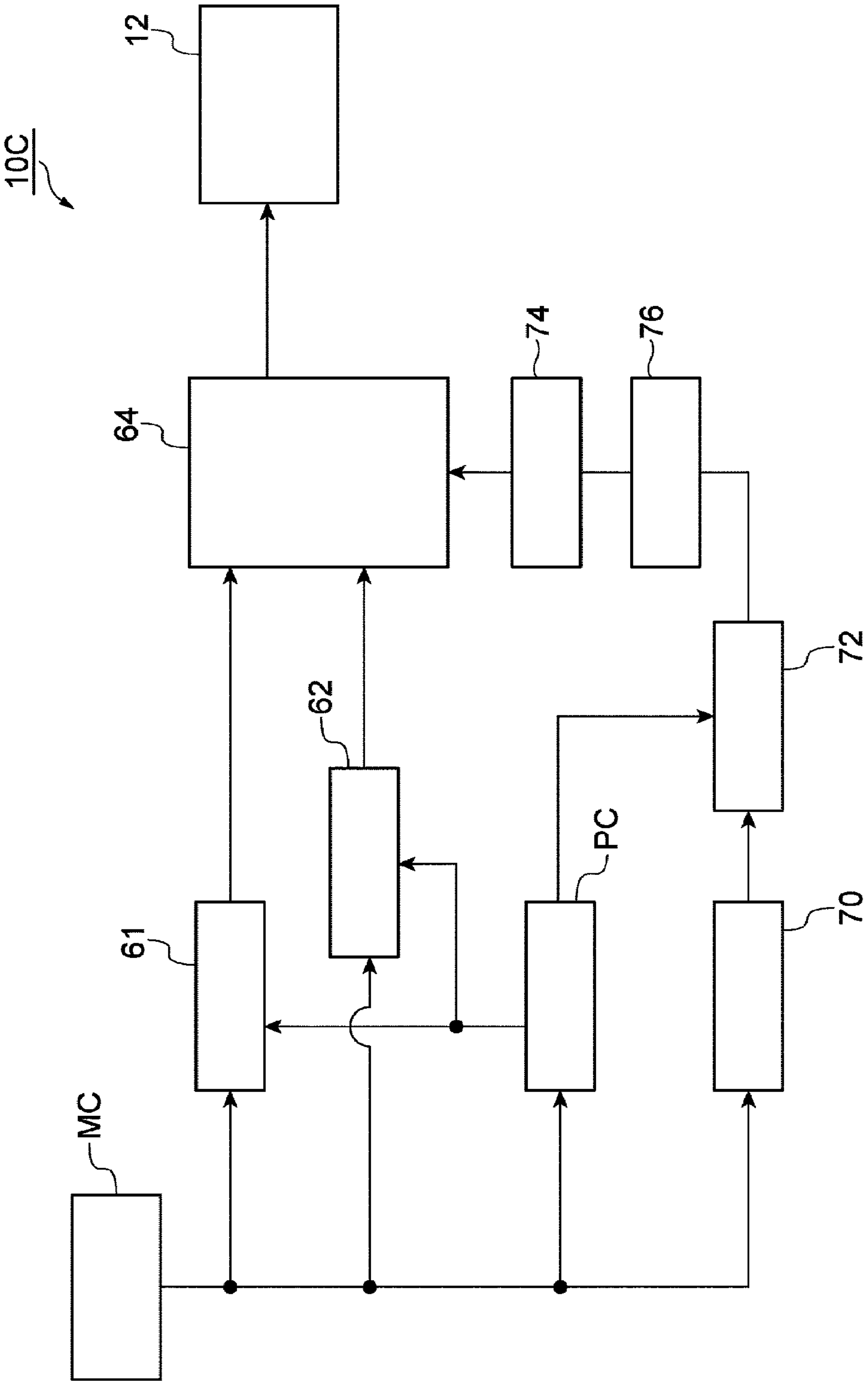
FIG. 10 is a diagram illustrating a power supply system and a control system of a plasma processing apparatus according to still yet another exemplary embodiment.

FIG. 10 is a diagram illustrating a power supply system and a control system of a plasma processing apparatus according to still yet another exemplary embodiment. A plasma processing apparatus 10C shown in FIG. 10 is different from the plasma processing apparatus 10 in that it is further equipped with a waveform adjuster 76. The waveform adjuster 76 is connected between the switching unit 72 and the radio frequency filter 74. The waveform adjuster 76 is configured to adjust a waveform of the DC voltage outputted from the DC power supply 70 via the switching unit 72, that is, the DC voltage having a negative value and a value of 0 V alternately. To elaborate, the waveform adjuster 76 adjusts the waveform of the DC voltage to be applied to the lower electrode 18 such that the waveform of the corresponding DC voltage has a triangular shape. The waveform adjuster 76 is implemented by, by way of non-limiting example, an integration circuit.

Figure 11:
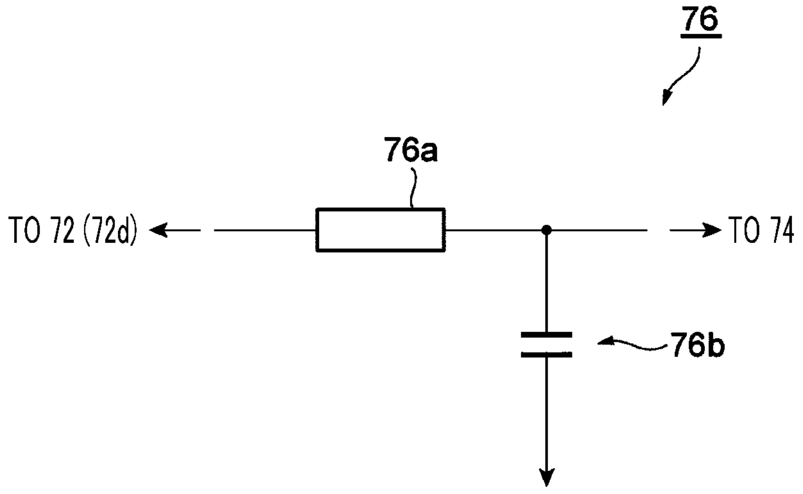
FIG. 11 is a circuit diagram illustrating an example of a waveform adjuster.

FIG. 11 is a circuit diagram illustrating an example of the waveform adjuster 76. The waveform adjuster 76 shown in FIG. 11 is implemented by an integration circuit and has a resistor element 76*a* and a capacitor 76*b*. One end of the resistor element 76*a* is connected to a resistor element 72*d* of the switching unit 72, and the other end of the resistor element 76*a* is connected to the radio frequency filter 74.

One end of the capacitor 76*b* is connected to the other end of the resistor element 76*a*. The other end of the capacitor 76*b* is connected to the ground. In the waveform adjuster 76 shown in FIG. 11, there is generated a delay in an increase and a decrease of the DC voltage outputted from the switching unit 72 based on a time constant determined by a resistance value of the resistor element 76*a* and an electrostatic capacitance value of the capacitor 76*b*. Accordingly, according to the waveform adjuster 76 shown in FIG. 11, it is possible to apply a voltage having a triangular waveform to the lower electrode 18 intentionally. According to the plasma processing apparatus 10C having this waveform adjuster 76, the energy of the ions irradiated to the inner wall of the chamber main body 12 can be adjusted.

So far, the various exemplary embodiments have been described. However, it should be noted that the above-described exemplary embodiments are not anyway limiting, and various changes and modifications may be made. By way of example, the plasma processing apparatuses according to the above-described various exemplary embodiments may not have the second radio frequency power supply 62. That is, the plasma processing apparatuses according to the above-described various exemplary embodiments may have a single radio frequency power supply.

Further, in the above-described various exemplary embodiments, the application of the negative DC voltage from the DC power supply to the lower electrode 18 and the stopping of this application are switched by the switching unit. If, however, the DC power supply itself is configured to switch the output of the negative DC voltage and the stopping of the output of this negative DC voltage, the switching unit is not required.

Furthermore, the inventive configurations of the above-described various exemplary embodiments may be combined in various ways. In addition, though the plasma processing apparatuses according to the above-described exemplary embodiments are configured as capacitively coupled plasma processing apparatuses, a plasma processing apparatus according to a modified exemplary embodiment may be configured as an inductively coupled plasma processing apparatus.

Further, if the duty ratio is high, the energy of the ions irradiated to the chamber main body 12 is increased. Accordingly, by setting the duty ratio to be of a high value, for example, larger than 40%, the cleaning of the inner wall of the chamber main body 12 can be performed.

Now, test experiments conducted regarding the plasma processing method using the plasma processing apparatus 10 will be discussed.

(First Test Experiment)

In the first test experiment, samples each having a silicon oxide film are respectively attached to the surface of the ceiling plate 34 at the chamber 12 side and the sidewall of the chamber main body 12 and a sample having a silicon oxide film is placed on the electrostatic chuck 20 of the plasma processing apparatus 10. Then, plasma processing is performed under the following conditions. Further, in the first test experiment, the duty ratio of the negative DC voltage applied to the lower electrode 18 periodically is used as a variable parameter.

<Conditions for Plasma Processing in First Test Experiment>

Internal pressure of the chamber 12*c*: 20 mTorr (2.66 Pa)

Flow rate of gases supplied into the chamber 12*c*

- $C_4F_8$ gas: 24 sccm
- $O_2$ gas: 16 sccm
- Ar gas: 150 sccm

First radio frequency power: continuous wave of 100 MHz and 500 W

Negative DC voltage applied to the lower electrode 18

- Voltage value: −3000 V
- Frequency: 200 kHz

Processing time: 60 seconds

Figure 12A:
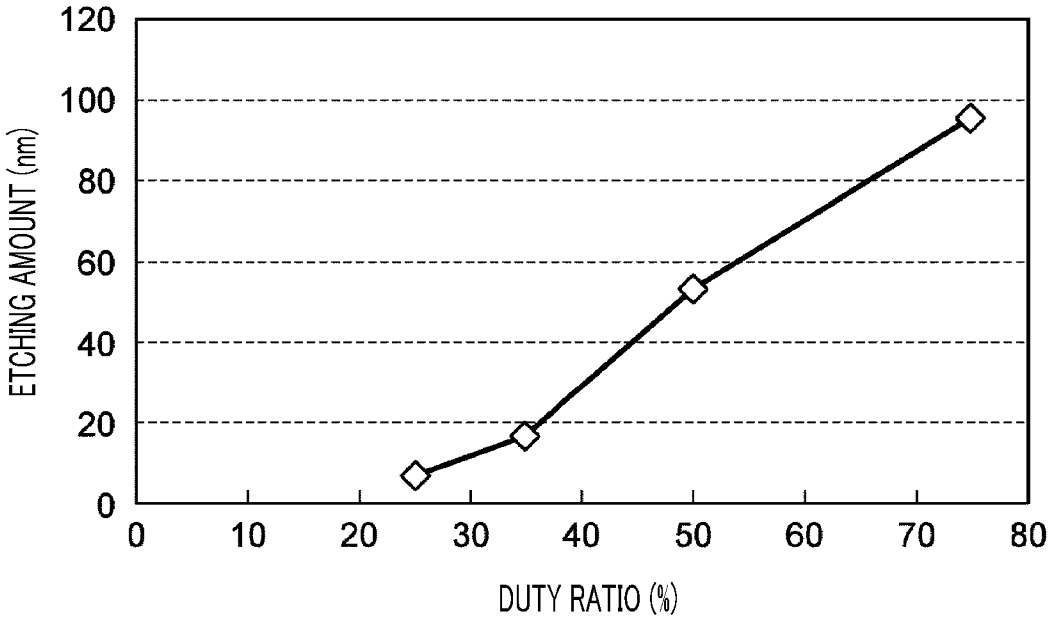
FIG. 12A is a graph showing a relationship between a duty ratio and an etching amount of a silicon oxide film of a sample, which is attached to a surface of a ceiling plate 34 at a chamber 12*c* side, obtained in a first test experiment.
Figure 12B:
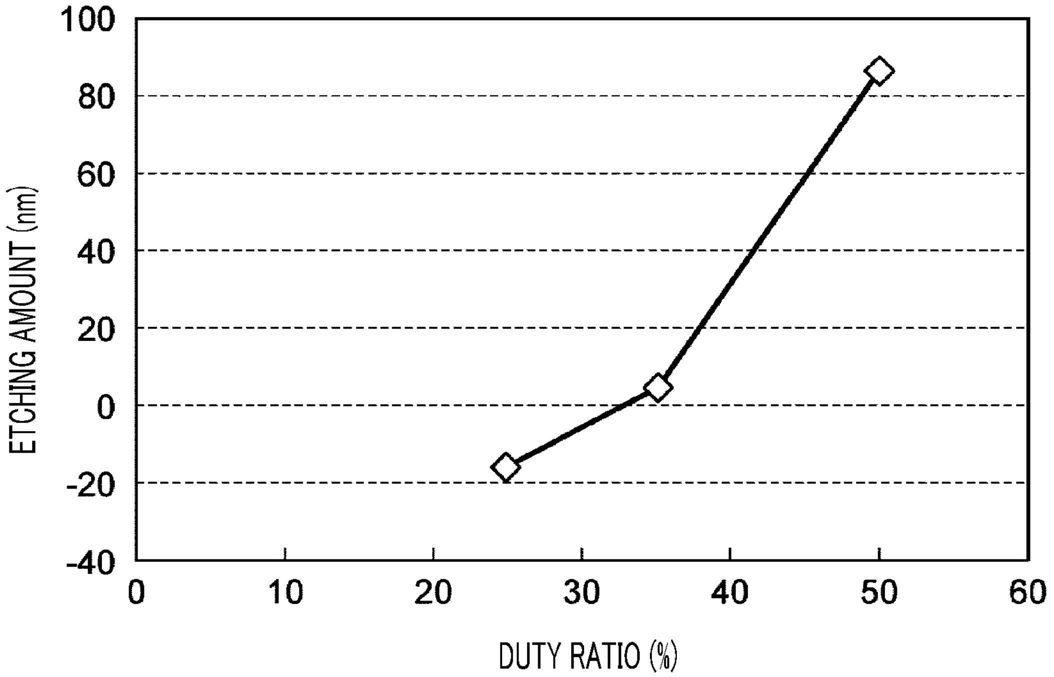
FIG. 12B is a graph showing a relationship between the duty ratio and an etching amount of a silicon oxide film of a sample attached, which is to a sidewall of the chamber main body 12, obtained in the first test experiment.
Figure 13:
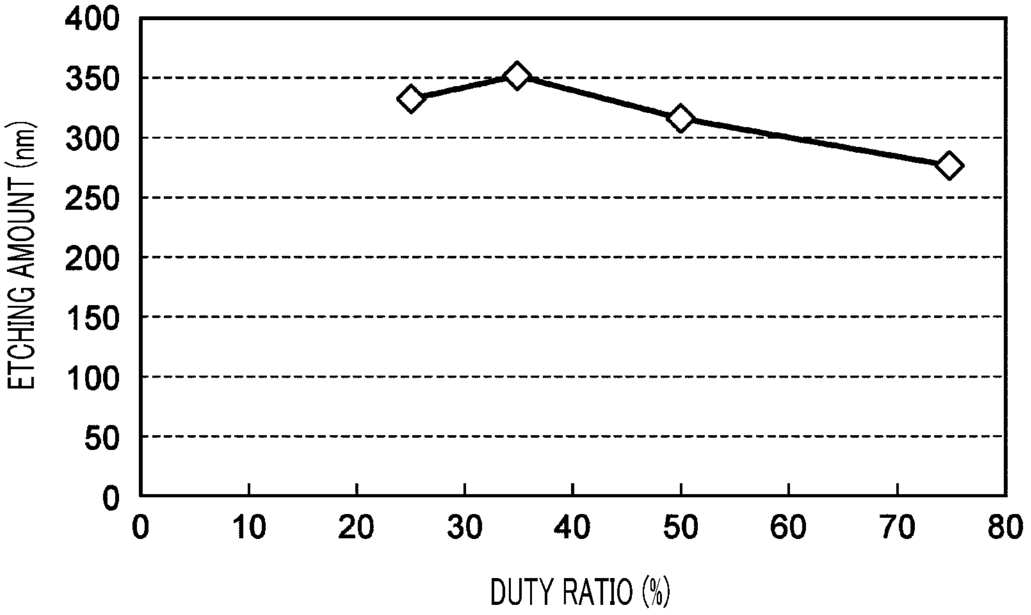
FIG. 13 is a graph showing a relationship between the duty ratio and an etching amount of a silicon oxide film of a sample, which is placed on an electrostatic chuck 20, obtained in the first test experiment.

In the first test experiment, an etching amount (film thickness decrement) of the silicon oxide film of the sample attached to the surface of the ceiling plate 34 at the chamber 12*c* side, an etching amount (film thickness decrement) of the silicon oxide film of the sample attached to the sidewall of the chamber main body 12 and an etching amount (film thickness decrement) of the silicon oxide film of the sample placed on the electrostatic chuck 20 are measured. FIG. 12A is a graph showing a relationship between the duty ratio and the etching amount of the silicon oxide film of the sample attached to the surface of the ceiling plate 34 at the chamber 12*c* side obtained in the first test experiment, and FIG. 12B is a graph showing a relationship between the duty ratio and the etching amount of the silicon oxide film of the sample attached to the sidewall of the chamber main body 12 obtained in the first test experiment. FIG. 13 is a graph showing a relationship between the duty ratio and the etching amount of the silicon oxide film of the sample placed on the electrostatic chuck 20 obtained in the first test experiment.

As depicted in FIG. 13, dependency of the etching amount of the silicon oxide film of the sample placed on the electrostatic chuck 20 upon the duty ratio is found to be small. Further, as shown in FIG. 12A and FIG. 12B, when the duty ratio is equal to or less than 35%, the etching amount of the silicon oxide film of the sample attached to the surface of the ceiling plate 34 at the chamber 12*c* side and the etching amount of the silicon oxide film of the sample attached to the sidewall of the chamber main body 12 are found to be reduced considerably. Accordingly, it is found out through the first test experiment that the dependency of the etching rate of the substrate upon the duty ratio occupied, within each cycle PDC, by the period during which the negative DC voltage is applied to the lower electrode 18 is small. Further, it is also found out that the etching rate of the chamber main body 12 is greatly reduced, that is, the energy of the ions irradiated to the inner wall of the chamber main body 12 is reduced when the duty ratio is small, particularly, equal to or less than 35%. Moreover, from the graphs of FIG. 12A and FIG. 12B, it is deemed that the energy of the ions irradiated to the inner wall of the chamber main body 12 would be considerably reduced if the duty ratio is equal to or less than 40%.

(Second Test Experiment)

In the second test experiment, samples each having a silicon oxide film are attached to the surface of the ceiling plate 34 at the chamber 12 side and the sidewall of the chamber main body 12 and a sample having a silicon oxide film is placed on the electrostatic chuck 20 of the plasma processing apparatus 10. Then, plasma processing is performed under the following conditions.

<Conditions for Plasma Processing in Second Test Experiment>

Internal pressure of the chamber 12*c*: 20 mTorr (2.66 Pa)

Flow rate of gases supplied into the chamber 12*c*

- $C_4F_8$ gas: 24 sccm
- $O_2$ gas: 16 sccm
- Ar gas: 150 sccm

First radio frequency power: continuous wave of 100 MHz and 500 W

Negative DC voltage applied to the lower electrode 18

Voltage value: −3000 V
Frequency: 200 kHz
Duty ratio: 35%
Processing time: 60 seconds Further, in a comparative experiment, samples each having a silicon oxide film are attached to the surface of the ceiling plate 34 at the chamber 12 side and the sidewall of the chamber main body 12 and a sample having a silicon oxide film is placed on the electrostatic chuck 20 of the plasma processing apparatus 10. Then, plasma processing is performed under the following conditions. A condition for the second radio frequency power in the comparative experiment is set such that an etching amount (film thickness decrement) of the silicon oxide film of the sample placed on the electrostatic chuck 20 is substantially same in the plasma processing of the second test experiment and the plasma processing of the comparative experiment.

<Conditions for Plasma Processing in Comparative Experiment>

Figure 14A:
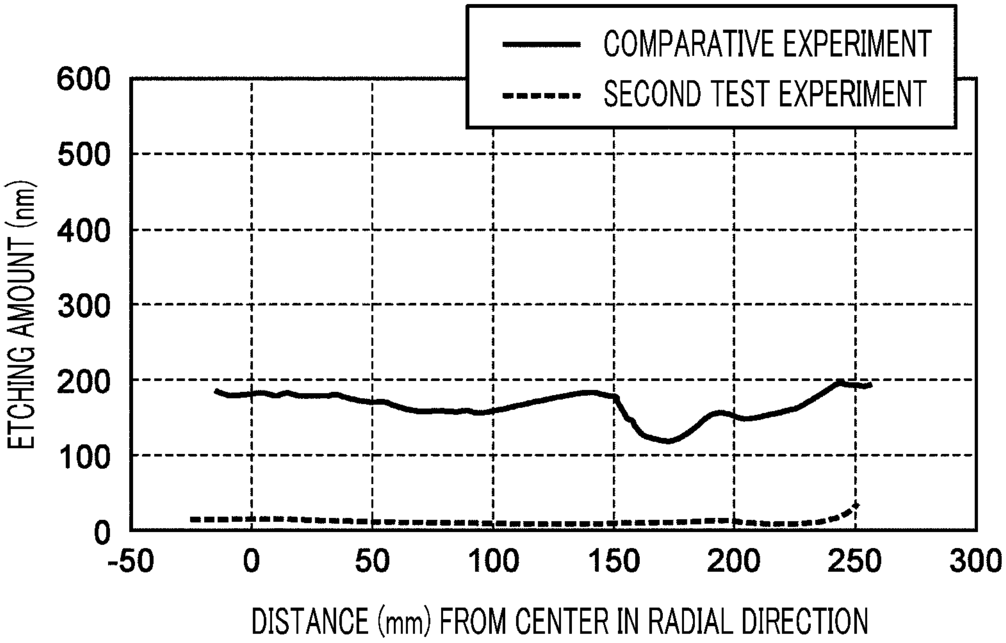
FIG. 14A is a graph showing etching amounts of silicon oxide films of samples, which are attached to the surface of the ceiling plate 34 at the chamber 12*c* side respectively, obtained in a second test experiment and a comparative experiment.
Figure 14B:
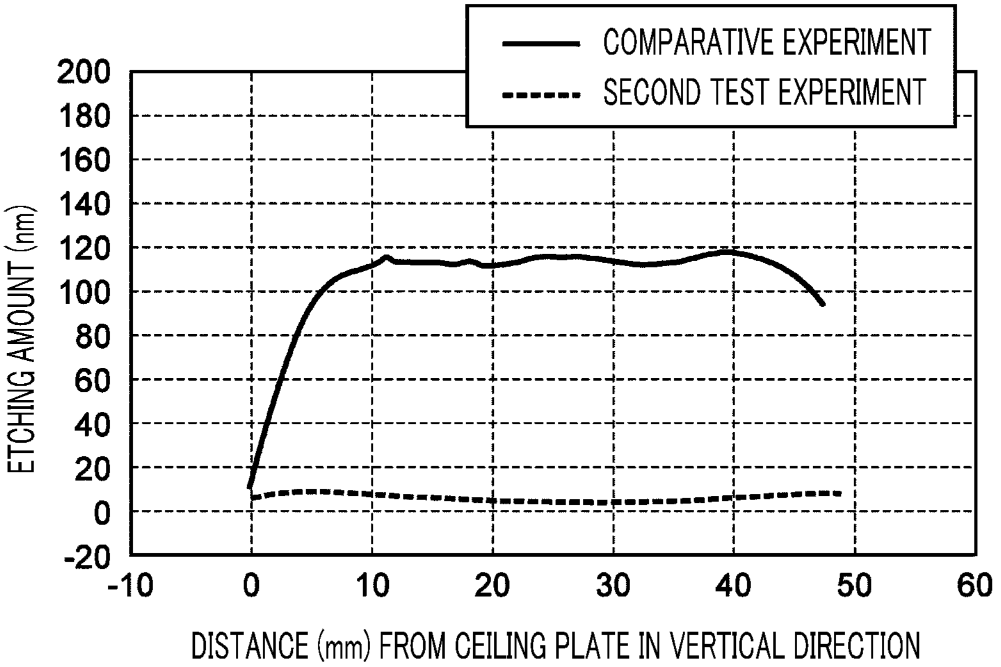
FIG. 14B is a graph showing etching amounts of silicon oxide films of samples, which are attached to the sidewall of the chamber main body 12 respectively, obtained in the second test experiment and the comparative experiment.

Internal pressure of the chamber 12*c*: 20 mTorr (2.66 Pa)
Flow rate of gases supplied into the chamber 12*c*
$C_4F_8$ gas: 24 sccm
$O_2$ gas: 16 sccm
Ar gas: 150 sccm
First radio frequency power: continuous wave of 100 MHz and 500 W
Second radio frequency power: continuous wave of 400 kHz and 2500 W
Processing time: 60 seconds In each of the second test experiment and the comparative experiment, an etching amount (film thickness decrement) of the silicon oxide film of the sample attached to the surface of the ceiling plate 34 at the chamber 12*c* side, and an etching amount (film thickness decrement) of the silicon oxide film of the sample attached to the sidewall of the chamber main body 12 are measured. FIG. 14A is a graph showing the etching amounts of the silicon oxide films of the samples attached on the surface of the ceiling late 34 at the chamber 12*c* side obtained in the second test experiment and the comparative experiment, respectively, and FIG. 14B is a graph showing the etching amounts of the silicon oxide films of the samples attached on the sidewall of the chamber main body 12 obtained in the second test experiment and the comparative experiment, respectively. On the graph of FIG. 14A, a horizontal axis represents a distance of a measurement position within the sample attached to the surface of the ceiling plate 34 at the chamber 12*c* side from a center of the chamber 12*c* in a radial direction, and a vertical axis indicates the etching amount of the silicon oxide film of the sample attached to the surface of the ceiling plate 34 at the chamber 12*c* side. On the graph of FIG. 14B, a horizontal axis represents a distance of a measurement position within the sample attached to the sidewall of the chamber main body 12 from the surface of the ceiling plate 34 at the chamber 12*c* side in a vertical direction, and a vertical axis indicates the etching amount of the silicon oxide film of the sample attached to the sidewall of the chamber main body 12.

As can be seen from FIG. 14A and FIG. 14B, as compared to the comparative experiment using the second radio frequency power, in the second test experiment in which the negative DC voltage is periodically applied to the lower electrode 18, the etching amount of the silicon oxide film of the sample attached to the surface of the ceiling plate 34 at the chamber 12*c* side and the etching amount of the silicon oxide film of the sample attached to the sidewall of the chamber main body 12 are found to be reduced considerably. Accordingly, it is found out that the energy of the ions irradiated to the wall surface of the chamber main body 12 and the wall surface of the upper electrode 30 can be greatly reduced while suppressing reduction of the energy of the ions irradiated to the substrate on the electrostatic chuck 20 by applying the negative DC voltage to the lower electrode 18 periodically, as compared to the case where the second radio frequency power, that is, the radio frequency bias power is used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A plasma processing apparatus, comprising:
a chamber;
a stage disposed in the chamber;
at least one electrode disposed in the stage;
an RF power source configured to supply an RF power to the at least one electrode and to excite a gas supplied into the chamber;
at least one DC voltage source configured to apply a DC voltage to the at least one electrode;
a switching unit, including a first transistor and a second transistor connected in series with each other, electrically connected to the at least one electrode and the at least one DC voltage source, and configured to apply a pulsed DC voltage from the at least one DC voltage source to the at least one electrode in a plurality of cycles, at least one of the plurality of cycles having a duty ratio equal to or less than 40%;
an RF filter is disposed between the switching unit and the at least one electrode; and
a controller electrically connected to the first and the second transistors and configured to control the RF power source and the switching unit, wherein
the controller is configured to periodically switch a control signal applied to the first and the second transistors such that application and non-application of the pulsed DC voltage from the at least one DC voltage source to the at least one electrode are periodically repeated,
the switching unit further includes:
a resistor element electrically connected in series to the first transistor and the second transistor; and
a capacitor electrically connected in parallel to the first transistor and the second transistor,
the RF filter is disposed between the resistor element and the at least one electrode, the first transistor is a first field effect transistor, and
the second transistor is a second field effect transistor with a channel polarity different from that of the first field effect transistor,
wherein the plasma processing apparatus further comprises:
a waveform adjuster disposed between the at least one electrode and the at least one DC voltage source, and
the waveform adjuster is disposed between the RF filter and the at least one DC voltage source.

2. The plasma processing apparatus of claim 1, wherein the waveform adjuster adjusts a waveform of the DC voltage to a triangular shape.

3. The plasma processing apparatus of claim 1, wherein the duty ratio is set to be equal to or less than 35%.

4. The plasma processing apparatus of claim 3, wherein the duty ratio is set to be equal to or less than 25%.

5. The plasma processing apparatus of claim 1, wherein the plasma processing apparatus is a capacitively coupled plasma processing apparatus.

6. The plasma processing apparatus of claim 1, wherein the plasma processing apparatus is an inductively coupled plasma processing apparatus.

7. A plasma processing apparatus, comprising:
a chamber;
a stage disposed in the chamber;
a lower electrode disposed in the stage;
an upper electrode disposed above the stage;
an RF source configured to supply an RF power to the lower electrode or the upper electrode;
a DC source configured to apply a pulsed DC voltage to the lower electrode in a plurality of cycles, at least one of the plurality of cycles having a duty ratio equal to or less than 40%;
a switching unit, including a first transistor and a second transistor connected in series with each other, electrically connected to the lower electrode and the DC source;
an RF filter is disposed between the switching unit and the at least one electrode; and
a controller electrically connected to the first and the second transistors and configured to control the RF source and the DC source, wherein
the controller is configured to periodically switch a control signal applied to the first and the second transistors such that application and non-application of the pulsed DC voltage from the DC source to the lower electrode are periodically repeated,
the switching unit further includes:
a resistor element electrically connected in series to the first transistor and the second transistor; and
a capacitor electrically connected in parallel to the first transistor and the second transistor,
the RF filter is disposed between the resistor element and the at least one electrode, the first transistor is a first field effect transistor, and
the second transistor is a second field effect transistor with a channel polarity different from that of the first field effect transistor,
wherein the plasma processing apparatus further comprises:
a waveform adjuster disposed between the lower electrode and the DC source, and
the waveform adjuster is disposed between the RF filter and the DC source.

8. The plasma processing apparatus of claim 7, wherein the waveform adjuster adjusts a waveform of the DC voltage to a triangular shape.

9. The plasma processing apparatus of claim 7, wherein the duty ratio is set to be equal to or less than 35%.

10. The plasma processing apparatus of claim 9, wherein the duty ratio is set to be equal to or less than 25%.

11. A plasma processing apparatus, comprising:
a chamber;
a stage disposed in the chamber;
at least one electrode disposed in the stage;
an RF power source coupled to the chamber and configured to generate an RF power;
a DC voltage source configured to apply a pulsed DC voltage to the at least one electrode in a plurality of cycles, at least one of the plurality of cycles having a duty ratio equal to or less than 40%;
a switching unit, including a first transistor and a second transistor connected in series with each other, electrically connected to the at least one electrode and the DC voltage source; and
a controller electrically connected to the first and the second transistors and configured to control the RF power source and the DC voltage source, wherein
the controller is configured to periodically switch a control signal applied to the first and the second transistors such that application and non-application of the pulsed DC voltage from the DC voltage source to the at least one electrode are periodically repeated,
the switching unit further includes:
a resistor element electrically connected in series to the first transistor and the second transistor; and
a capacitor electrically connected in parallel to the first transistor and the second transistor,
the RF filter is disposed between the resistor element and the at least one electrode,
the first transistor is a first field effect transistor, and
the second transistor is a second field effect transistor with a channel polarity different from that of the first field effect transistor,
wherein the plasma processing apparatus further comprises:
a waveform adjuster disposed between the at least one electrode and the DC voltage source, and
the waveform adjuster is disposed between the RF filter and the DC voltage source.

12. The plasma processing apparatus of claim 11, wherein the waveform adjuster adjusts a waveform of the DC voltage to a triangular shape.

13. The plasma processing apparatus of claim 11, wherein the duty ratio is set to be equal to or less than 35%.

14. The plasma processing apparatus of claim 13, wherein the duty ratio is set to be equal to or less than 25%.

15. The plasma processing apparatus of claim 1, wherein the controller is configured to control the RF power source and the switching unit such that applying of the RF power is stopped while the pulsed DC voltage is applied, and the RF power is applied while applying of the pulsed DC voltage is stopped.

16. The plasma processing apparatus of claim 1, further comprising:

a second RF power source for bias that is electrically connected to the at least one DC voltage source, wherein the controller is configured to selectively apply either the DC voltage from the at least one DC voltage source or a second RF power from the second RF power source to the at least one electrode.

17. The plasma processing apparatus of claim 1, wherein a first end of the capacitor is connected to a cathode of the at least one DC voltage source and to a source of the first field effect transistor, and a second end of the capacitor is connected to a source of the second field effect transistor.

18. The plasma processing apparatus of claim 17, wherein the source of the second field effect transistor is connected to a ground, and a gate of the first field effect transistor is connected to a gate of the second field effect transistor.

* * * * *